TUNING CIRCUITS FOR TUNING TO AT LEAST TWO SEPARATE FREQUENCY BANDS
Filed July 11, 1966
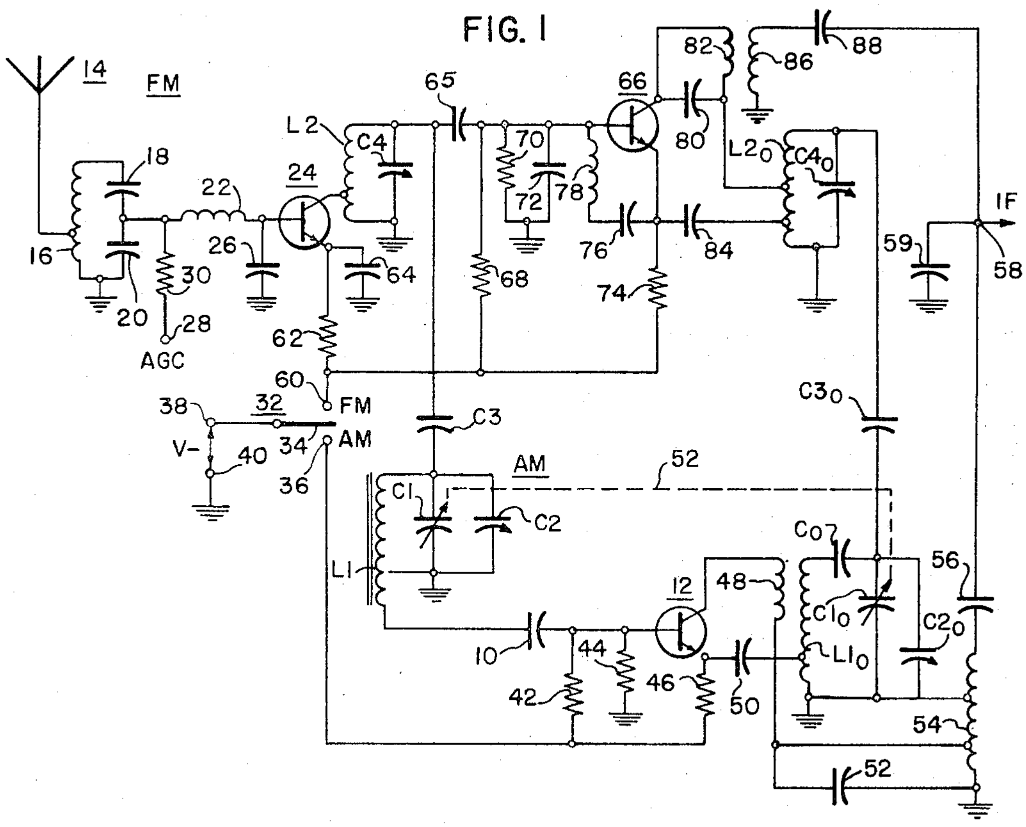
FIG. 2
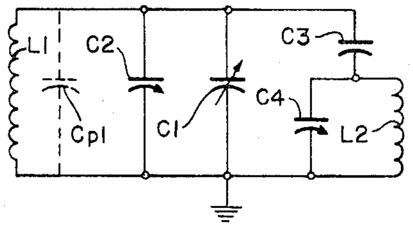
FIG. 3
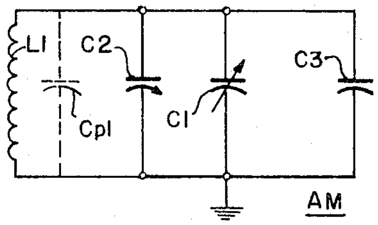
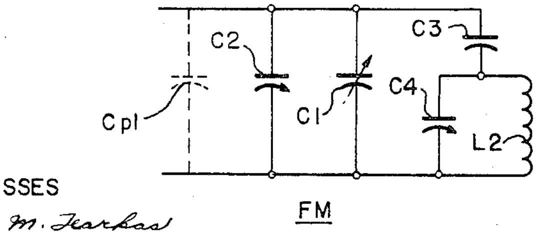
FIG.4
WITNESSES
Helen M. Tarkas
James F. Young
INVENTOR
DIRK J. BOOMGAARD
BY [signature]
ATTORNEY United States Patent Office 3,440,545
Patented Apr. 22, 1969

3,440,545

TUNING CIRCUITS FOR TUNING TO AT LEAST TWO SEPARATE FREQUENCY BANDS

Dirk J. Bloomgaard, Murrysville, Monroeville, Pa., assignor to Westinghouse Electric Corporation, Pittsburgh, Pa., a corporation of Pennsylvania Filed July 11, 1966, Ser. No. 564,202
Int. Cl. H04b *1/06*
U.S. Cl. 325—460 10 Claims

ABSTRACT OF THE DISCLOSURE

A simplified tuning circuit with an input tuning stage and a frequency converter tuning stage, both the input and converter stages having tow inductive devices, a tuning capacitive device, and at least one additional capacitive device for tuning to two separate frequency bands. During operation in frequency band one, inductive devices two in the input and the converter stages do not affect tuning. During operation in frequency band two, inductive devices one in the input and the converter stages do not affect tuning. The input tuning capacitive device and the converter capacitive device are ganged together so that the input stage and the converter stage are tuned coincidently.

The present invention relates generally to tuning circuits and, more particularly, to tuning circuits capable of tuning to frequencies within at least two separate frequency bands.

Presently available AM-FM radio receivers employ separate tuning circuits for the AM and FM sections thereof. This necessitates that separate inductive coils be provided for the AM and the FM bands and also requires that separate gang capacitors be utilized for tuning within the AM and FM bands. It is common practice to use two individual gang capacitors. One is used for tuning the input AM tuned circuit of the receiver and the AM frequency converter or local oscillator for the AM band. Another separate gang capacitor is used for tuning the input FM tuned circuit of the receiver and also the FM frequency converter or local oscillator of the FM portion of the receiver. An alternate technique for providing tuning in the AM and FM band is to use a multiple gang tuning capacitor with separate portions thereof providing the necessary tuning capacitance for the AM and FM bands. This requires a gang capacitor with four or more separate stator and rotor sections. The requirement for two separate gang tuning capacitors or a multiple gang tuning capacitor of course increases the cost of an AM-FM radio receiver as well as requiring more space for the physical placement of the ganged capacitors within the receiver.

It is therefore an object of the present invention to provide a new and improved tuning circuit capable of being tuned within at least two frequency bands.

It is a further object of the present invention to provide a new and improved tuning circuit capable of being tuned within at least two frequency bands which eliminates the need for separate gang capacitors or multiple gang capacitors.

It is a further object to provide in receiving apparatus new and improved tuning circuits capable of being tuned within two bands of frequency without the necessity of separate tuning elements in each of the bands.

It is a further object to provide new and improved tuning circuits utilizing a single tuning element which is capable of tuning to frequencies within both the AM and FM frequency bands.

It is a still further object to provide in receiving apparatus new and improved tuning circuits capable of tuning to frequencies within the AM and FM frequency band without the necessity of using separate tuning elements in the AM and FM portions thereof.

Broadly, the present circuit provides a tuning circuit capable of being tuned in at least two frequency bands within a capacitive element is used as the tunable element in each of the frequency bands, and the associated inductive elements for each of the bands are so selected as to not affect the tuning of the circuit when not tuning in the band associated with a given inductive element.

These and other objects of the present invention will become more apparent when considered in view of the following specification and drawings in which:

FIGURE 1 is a schematic diagram embodying the circuitry of the present invention;

FIG. 2 is a schematic diagram used in explaining the operation circuitry of the present invention;

FIG. 3 is a schematic diagram used in explaining the operation of the present invention; and FIG. 4 is a schematic diagram used in explaining the operation of the present invention.

Referring first to FIG. 1, the front end of a combination AM-FM radio receiver is shown. The AM portion thereof includes an inductance coil L1, which may have an iron core as indicated. A variable tuning capacitor C1 is connected from the top end of the tuning coil L1 to a tap thereon which is grounded. A trimmer capacitor C2 is connected across the tuning capacitor C1. The bottom end of the inductance coil L1 is connected to a coupling capacitor 10 which has its other end connected to the base electrode of a transistor 12, which is the active element of the AM frequency converter circuit of the circuitry as shown.

The FM portion of the circuit includes an FM antenna 14 which is connected to a tap on an inductance coil 16. A pair of capacitors 18 and 20 are connected across the coil 16 with the bottom end of the coil 16 and the capacitor 20 being grounded. From the junction between the capacitors 18 and 20 an inductor 22 is connected to the base electrode of a transistor 24. The transistor 24 operates as an RF amplifier for the FM portion of the circuitry. A capacitor 26 is connected from the base electrode of the transistor 24 to ground. An AGC voltage is applied from a terminal 28 to a resistor 30 to the base of the transistor 24 via the inductor 22. The AGC voltage applied to the transistor 24 controls the gain of the transistor 24 thereof as is well known in the art. The inductor 16, the capacitors 18 and 20 and the LC circuit, including the inductor 22 and the capacitor 26, provide a preselection and matching circuit which has a bandwidth sufficient to receive the FM band of frequency which extends from 87.5 megacycles to 108.5 megacycles, and also matches the impedance of the antenna 14 to the input circuit.

The collector of the RF amplifier transistor 24 is connected to a tap on an inductor L2. A trimmer capacitor C4 is connected across the inductor L2 with the bottom end of the inductor L2 and capacitor C4 being grounded. Connected in series between the top end of the inductor L2 and the capacitor C4 and the top end of the tuning capacitor C1 and the trimmer capacitor C2 is a padding capacitor C3.

The elements L1, C1, C2, C3, C4 and L2 comprise the tuning components for both the AM and FM portions of the receiver as will now be described.

FIG. 2 shows a simplified schematic of the tuning elements. This circuit shows the AM tuning inductor L1 shunted by its inherent capacitance designated in dotted lines represented by $C_{p1}$. The tuning capacitor C1 and the AM trimmer capacitor C2 are connected directly across the coil L1. The padding capacitor C3 is connected in series with the tuning capacitor C1 and the parallel combination of the FM tuning coil L2 and the FM trimmer capacitor C4.

At frequencies within the AM frequency band, 530 kilocycles to 1620 kilocycles, the inductor L2 is selected to have such a small value of inductance to provide negligible impedance at these frequencies. This low value of impedance essentially connects the bottom end of the capacitor C3 to ground. The trimmer capacitor C4 is thereby shunted or taken effectively out of the circuit. In other words, the inductor L2 is selected to have such a low value of inductance at frequencies within the AM band that it provides a short-to-ground from the bottom end of the capacitor C3. The inductor L2 and the capacitor C4 thus, in effect, are taken out of the AM tuning circuit and do not affect tuning of frequencies within the AM band of frequencies.

FIG. 3 shows the equivalent circuit of the input tuning circuit for tuning in the AM band of frequencies. The circuit shows the AM tuning inductor L1 connected across the parallel combination of its inherent capacitance $C_{p1}$ and the capacitors C1, C2 and C3. The tuning range of the AM frequency band may be determined by the following equation:

$$\frac{f_{max}}{f_{min}}(\mathrm{AM})=\sqrt{\frac{C_{1\,max}+C_{p1}+C_2+C_3}{C_{1\,min}+C_{p1}+C_2+C_3}}$$

where:

$$\frac{f_{max}}{f_{min}}(\mathrm{AM})$$

is the ratio of the maximum to minimum frequency for the AM band; $C_{1\,max}$ is the maximum capacitance of the variable tuning capacitor C1; $C_{1\,min}$ is the minimum capacitance of the variable tuning capacitor C1; and $C_{p1}$, C2 and C3 are the respective capacitances of the associated capacitors as shown in the figures. The trimmer capacitor C2 has a small adjustable range and serves the purpose of setting the high frequency end of the AM band to its correct value.

With the component values being properly selected to cover the ranges of the AM frequency band, tuning may be accomplished by the adjustment of the tuning capacitor C1 between its maximum and minimum ranges for the various AM stations within the AM band.

FIG. 4 shows the equivalent circuit of the tuning circuit of FIG. 2 at frequencies within the FM frequency band of 87.5 megacycles to 108.5 megacycles. At the relatively high FM frequencies as compared to the AM frequencies, due to the relatively high inductance of the AM tuning coil L1, the impedance across this coil will be very high. Thus it will appear though there is an open circuit across the inductor L1, with the inductor L1 effectively being removed from the circuit. The inherent capacitance $C_{p1}$ of the coil L1 however will appear in the circuit as shown in FIG. 4. The tuning elements for the FM case are then C1, C2, C3, C4, $C_{p1}$ and L2, with the FM inductor L2 becoming effective at FM frequencies to provide tuning inductance. The frequency range for tuning the extremities of the FM band may be defined by the equation:

$$\frac{f_{max}}{f_{min}}(\mathrm{FM})=\sqrt{\frac{C_4+\dfrac{C_3(C_{1\,max}+C_2+C_{p1})}{C_3+C_{1\,max}+C_2+C_{p1}}}{C_4+\dfrac{C_3(C_{1\,min}+C_2+C_{p1})}{C_3+C_{1\,min}+C_2+C_{p1}}}}$$

where:

$$\frac{f_{max}}{f_{min}}(\mathrm{FM})$$

is the ratio of maximum to minimum frequency in the FM band, and the total capacitance in the circuit is the sum of C4 and C3 in series with the sum of C1, C2 and $C_{p1}$.

By the selection of the trimmer capacitor C4 and the previous selection of the other omponent values tuning may be accomplished within the FM frequency band by the adjustment of the tuning capacitor C1, without the necessity of utilizing a separate capacitor for tuning within the FM frequency band. The capacitor C4 is selected to have a slight trimmer adjustment to set the upper end of the FM frequency band at a proper value. It should be noted that the capacitance of the padding capacitor C3 is selected to be several times smaller than that of $C_{1\,max}$, but still larger than $C_{1\,min}$. This permits the tuning range in the FM case to be much smaller than in the AM case as is required. This is asuming that $C_{p1}$, C2 and C4 are relatively small.

A typical example of circuit components which will provide tuning in both the AM and FM frequency bands through the use of a single capacitor C1 are as follows:

| | | |
|---|---|---|
| L1 | microhenries | 240 |
| $C_{p1}$ | picofarads | 2 |
| $C_{1\,max}$ | do | 333.5 |
| $C_{1\,min}$ | do | 6.5 |
| C2 | do | 13 |
| C3 | do | 24 |
| C4 | do | 15.3 |
| L2 | microhenries | 0.15 |

In FIG. 1 for AM operation a switch 32 is placed in the AM position with a movable arm 34 of the switch contacting the AM terminal 36. A negative polarity direct potential V− is applied between a terminal 38, at a negative polarity, and a terminal 40 at ground potential. With the switch 32 in its AM position, the negative potential V− is applied to the transistor 12 to supply biasing and operating potential thereto. A biasing resistor 42 is connected between the AM terminal 36 and the base transistor 12 with another biasing resistor 44 connected between the base and ground. A resistor 46 is connected between the terminal 36 and the emitter of the transistor 12 to apply operating potential thereto.

Incoming radio frequency signals in the AM band are received by the inductance coil L1. The receiver is tuned by the capacitor C1 to the frequency of the incoming signal as previously explained. With the input portion of the receiver being so tuned, the AM signals are translated through the coupling capacitance 10, to the base of the AM frequency converter transistor 12. An inductance coil 48 is connected at one end to the collector electrode of the transistor 12. The coil 48 is coupled inductively to an inductance coil $L1_o$. Connected between a tap on the inductor $L1_o$ and the emitter electrode is a feedback capacitor 50. In series with the top end of the inductance coil $L1_o$ is connected a padding capacitor $C_o$. A variable capacitor $C1_o$ is connected between the other end of the capacitor $C_o$ and ground. A trimmer capacitor $C2_o$ is connected across the variable capacitor $C1_o$. A capacitor $C3_o$ is connected between the ungrounded end of the capacitor $C1_o$ and the parallel combination of an inductance coil $L2_o$ and a capacitor $C4_o$. The other end of the parallel combination of the inductor $L2_o$ and the capacitance $C4_o$ is grounded.

The components with the *o* subscript, namely, $L1_o$, $C1_o$, $C2_o$, $C3_o$, $C4_o$ and $L2_o$ correspond in function, respectively, to the components L1, C1, C2, C3, C4 and L2 of the input tuned circuit as previously described. Similarly the circuit components are designed so that the frequency converter tuning capacitor $C1_o$ may tune for both AM and FM operations. In the AM case the inductor $L2_o$ provides very low impedance to ground and thereby effectively shorts the capacitor $C4_o$. This places the capacitor $C3_o$ directly across the capacitors $C1_o$ and $C2_o$. The equivalent circuit would thus be as shown in FIGURE 3 except for the padding capacitor $C_o$ connected between the coil $L1_o$ and the parallel combination of the capacitors.

The input tuning capacitor C1 is mechanically ganged to the frequency converter tuning capacitor $C1_o$ as indicated by a dotted line 52. The capacitors C1 and $C1_0$ could comprise a well known type of ganged capacitor including two sets of fixed stator blades and two sets of rotor blades mounted on a common shaft to form two capacitor sections. The tuning of the common shaft causes the capacitance of the associated stator and rotor blades of each capacitor section to change in correspondence thereto. Thus the adjustments of the tuned frequency of the input tuning circuit through the capacitor C1 will adjust the tuned frequency of the AM frequency converter circuit similarly by the ganged adjustment of the capacitor $C1_0$. The purpose for the padding capacitor $C_0$ is to permit tracking between the frequency converter tuned frequency and the input tuned frequency when using a gang capacitor wherein both portions thereof change an equal amount of capacitance for a given angular rotation of the rotor blades thereof. This is necessary since the ratio of change of frequency for the frequency converter is less than that for the input tuned circuit. If uneven amounts of change of capacitance were utilized for a given angular rotation of the tuning shaft between the capacitors C1 and $C1_0$, the padding capacitor $C_0$ could be eliminated.

The frequency converter tuned circuit is tuned at a frequency different from the input tuned frequency by the AM intermediate frequency so that the AM intermediate frequency may be developed at the output of the AM frequency converter circuit. Thus the AM frequency converter tuned circuit is tuned to a frequency of 455 kc. higher than that of the input tuned circuit. The coil 48 is connected to a tuned circuit tuned to the intermediate frequency. The intermediate frequency tuned circuit includes a capacitor 52 and an inductor 54, the capacitor 52 being connected between the tap on the inductor 54 and the grounded end of the inductor 54. The intermediate frequency signals appearing at the intermediate frequency circuit are applied through a coupling capacitor 56 to an intermediate circuit lead 58 to be applied to subsequent stages of the radio receiver for AM demodulation and sound reproduction as is well known in the art. A capacitor 59 is connected between the lead 58 and ground to complete the circuit and provide impedance matching to the next stage.

Thus, with the switch 32 in the AM position signals within the AM frequency band are tuned by the adjustment of the capacitor C1 of the input tuning circuit. These signals at the frequency to which the input tuned circuits are tuned are applied to the base of the transistor 12 of the AM frequency converter circuit. The capacitor $C1_0$ of the AM frequency converter is ganged with the capacitor C1 and thereby tunes the frequency converter circuit to a frequency which differs from the tuned frequency of the input tuned circuit by the AM intermediate frequency. The output of the AM frequency converter from a tuned circuit tuned to the AM intermediate frequency is that applied as the intermediate frequency signals to subsequent stages of the receiver.

For FM reception in the circuit as shown in FIG. 1 the switch 52 is placed in the FM position with the movable arm 34 connected to a terminal 60 which establishes the FM position. The RF amplifier transistor 24 is supplied operating potential through a resistor 62 connected between the terminal 60 and the emitter electrode of the transistor 24. A capacitor 64 is connected between the emitter electrode of the transistor 24 and ground to provide an AC bypass for the amplifier circuit. Signals within the FM frequency band will thus appear at the collector of the transistor 24. The particular FM frequency is tuned by the input tuning capacitor C1 as previously explained. At FM frequencies the inductor L1 is effectively taken out of the tuning circuit and the input tuning circuit for the FM case is substantially the circuit as shown in FIG. 4 and operates as previously described.

The FM signals of the tuned frequency are then applied through a coupling capacitor 65 which is connected between the ungrounded end of the parallel combination of the inductor L2 and capacitor C4 to the base of a transistor 66, which constitutes the active element of the FM frequency converter circuit of the present receiver. A bias resistor 68 is connected between the FM terminal 60 and the base of the transistor 66, with a bias resistor 70 being connected between the base electrode and ground. A capacitor 72 is connected between the base electrode and ground, to provide a low impedance path to ground for oscillator signals and matching the base impedance to L2. Operating potential is applied to the transistor 66 from a resistor 74 which is connected between the emitter of the transistor and the terminal 60. A series combination of a capacitor 76 and an inductor 78 are connected between the emitter and base electrode of the transistor 66. The collector of the transistor 66 is connected through a parallel combination of a capacitor 80 and an inductor 82 to a tap on the inductor $L2_0$. From another tap on the inductor $L2_0$, a capacitor 84 is connected with its other end connected to the emitter electrode of the transistor 66. The parallel circuit including the capacitor 80 and the inductor 82 is tuned to the FM intermediate frequency which is 10.7 megacycles. The inductor 82 is inductively coupled to an inductance coil 86 which has one end grounded and the other end connected to a capacitor 88. The other end of the capacitor 88 is connected to the intermediate frequency lead 58.

Signals of the selected FM frequency are applied through the capacitor 64 to the base of the FM frequency converter transistor 66. The FM frequency converter circuit is tuned by the capacitor $C1_0$ which is ganged to the input tuning capacitor C1. Thus when the capacitor C1 selects the particular input tuned FM frequency, the capacitor $C1_0$ selects the proper tuned frequency for the FM converter circuit which differs from the selected input FM frequency by the FM intermediate frequency. The output tuned circuit of the FM frequency converter circuit includes the capacitor 80 and the inductor 82 which are tuned to the FM intermediate frequency and therefore translate to the inductor coil 86 FM signals at the intermediate frequency. These signals are applied to the IF lead 58 for the FM demodulation and sound reproduction as is well known for FM receivers.

At frequencies within the FM band the inductive reactance of the inductor $L1_0$ is high, and thereby this coil is effectively removed from the circuit. Therefore, the tuning inductance is provided mainly by the coil $L2_0$.

It can thus be seen that the circuitry as shown in FIG. 1 can be tuned to frequencies within both the AM and FM frequency bands through the use of only one gang capacitor including the input tuning capacitor C1 and the frequency converter capacitor $C1_0$. For the AM case the capacitor C1 determines the input AM frequency to which the receiver is tuned, while the capacitor $C1_0$, ganged to the capacitor C1, fixes the tuned frequency of the AM frequency converter so that the AM intermediate frequency is developed at the output thereof. For the FM case, the capacitor C1 determines the frequency within the FM band to which the input tuning circuit is tuned. The capacitor $C1_0$ which is ganged to the capacitor C1, sets the FM frequency converter circuit to a corresponding frequency which differs from the selected FM frequency by the FM intermediate frequency signal.

It can thus be seen that the gang capacitor including the capacitor C1 and the capacitor $C1_0$, as schematically shown in FIGURE 1, tunes for receiving signals in both the AM and FM frequency bands without the necessity of separate tuning capacitors for these respective frequency bands.

Although the present invention has been described with a certain degree of particularity it should be understood that the present disclosure has been made only by way of example and that numerous changes of the detailed construction and combination arrangement, parts, elements and components can be resorted to without departing from the spirit and scope of the present invention.

I claim as my invention:

1. A tuning circuit operative to tune to frequencies within first and second frequency band comprising:
tuning capacitive means,
first inductive means,
second inductive means, and
second capacitive means,
said tuning capacitive means,
said first inductive means and said second capacitive means forming a first tuning circuit capable of being tuned by said tuning capacitive means to frequencies within said first band of frequencies,
said second inductive means being so selected as to not affect tuning within said first band,
said tuning capacitive means, said second inductive means and said second capacitive means forming a second tuning circuit capable of being tuned by said tuning capacitive means to frequencies within said second band of frequencies,
said first inductive means being so selected as to not affect tuning within said second band.

2. The tuning circuit of claim 1 wherein said first frequency band is in a lower frequency range than said second band and wherein:
said tuning capacitive means comprises a variable capacitor whose capacitance may be adjusted between maximum and minimum values to permit tuning at the extremities of said first and second bands.

3. The tuning circuit of claim 2 wherein said first band of frequencies comprises the AM band and said second band of frequencies comprise the FM band and wherein:
said first inductive means includes a first inductor connected across said variable capacitor,
said second inductive means includes a second inductor, and
said second capacitive means comprises a padding capacitor operatively connected between said variable capacitor and said second inductor.

4. The circuit of claim 3 further including:
a first trimmer capacitor connected across said first inductor for adjusting the high frequency end of said AM band.

5. The circuit of claim 4 further including:
a second trimmer capacitor connected across said second inductor for adjusting the high frequency end of said FM band.

6. The circuit of claim 3 wherein:
said first inductor being so selected to provide a high impedance at frequencies within said FM band so as to be effectively out of said second tuned circuit, and
said second inductor being so selected to provide a low impedance at frequencies within said AM band so as to effectively connect said second capacitor across said variable capacitor.

7. In apparatus for receiving input signals having frequencies within first and second bands of frequencies, the combination of:
an input tuning circuit responsive to signals within said first and second frequency bands comprising;
input tuning capacitive means,
first input inductive means,
secod input inductive means, and
second input capacitive means,
a first input tuned circuit being formed including said first input inductive means, said first tuning capacitive means and said second input capacitive means, said first input tuned circuit capable of being tuned by said tuning capacitive means to frequencies within said first band of frequencies,
said second input inductive means being so selected as to not affect tuning within said first band,
a second input tuned circuit being formed including said tuning capacitive means, said second input inductive means and said second input capacitive means, said second input tuned circuit capable of being tuned by said tuning capacitive means to frequencies within said second band of frequencies,
said first input inductive means being so selected so as to not affect tuning within said second band;
first frequency converter means responsive to signals from said first input tuned circuit for converting signals therefrom in said first band to a first intermediate frequency;
second frequency converter means responsive to signals from said second input tuned circuit for converting signals therefrom in said second band to a second intermediate frequency;
a frequency converter tuning circuit for tuning said first and second frequency converter circuits respectively to first and second converter frequencies having frequency values with respect to the tuned frequency of said first and second input tuned circuits to develop said first and second intermediate frequencies respectively from said first and second frequency converter means,
said frequency converter tuning circuit comprising,
converter tuning capacitive means,
first converter inductive means,
second converter inductive means, and
second converter capacitive means,
a first converter tuned circuit being formed including said converter tuning capacitive means, said first converter inductive means and said second converter capacitive means, said first converter tuned circuit capable of being tuned by said converter tuning capacitive means to first converter frequencies capable of developing said first intermediate frequency,
said second converter inductive means being so selected as to not affect tuning at said first converter frequencies,
a second converter tuned circuit being formed including said converter tuning capacitive means, said second converter inductive means and said second converter capacitive means, said second converter tuned circuit capable of being tuned by said converter tuning capacitive means to second converter frequencies so as to develop signals at said second intermediate frequency,
said first converter inductive means being so selected as to not affect tuning at said second converter frequencies; and
said input tuning capacitive means and said converter tuning capacitive means being ganged together so that said input tuning circuit and said converter tuning circuit are tuned coincidently.

8. In the apparatus of claim 7 wherein said first band comprises the AM band and said second band comprises the FM band and wherein:
said input tuning capacitive means and said converter tuning capacitive means comprising a pair of variable tuning capacitors ganged together so that their capacitance is varied coincidently.

9. In the apparatus of claim 8 wherein:
said first input inductive means includes a first input inductor connected across one of said pair of variable tuning capacitors,
said first converter inductive means includes a first converter inductor operatively connected across the other of said pair of variable tuning capacitors,
said second input inductive means and said second converter inductive means include, respectively, a second input inductor and a second converter inductor,
said second input capacitive means and said second converter capacitive means include, respectively, a second input capacitor and a second converter capacitor connected, respectively, between said input variable tuning capacitor and said second input inductor, and said converter variable tuning capacitor and said second converter inductor.

10. In the apparatus of claim 9 wherein:

said first input inductor and said first converter inductor being so selected to provide high impedances when tuning at frequencies within said FM band so as to be effectively out of said second input tuned circuit and said second converter tuned circuit, respectively, said second input inductor and said second converter inductor being so selected to provide a low impedance when tuning at frequencies within said AM band so as to effectively connect said second input capacitor across said input variable tuning capacitor and said second converter capacitor across said converter variable tuning capacitor, respectively.

References Cited

UNITED STATES PATENTS

| | | |
|---|---|---|
| 2,601,475 | 6/1952 | Vilkomerson. |
| 2,902,598 | 9/1959 | Hills. |
| 3,054,058 | 9/1962 | Towler. |
| 3,389,338 | 6/1968 | Slavin. |

WILLIAM C. COOPER, *Primary Examiner.*

CHARLES JIRAUCH, *Assistant Examiner.*

U.S. Cl. X.R.

325—315, 458, 462